United States Patent [19]

Matsumoto et al.

[11] Patent Number: 4,719,358

[45] Date of Patent: Jan. 12, 1988

[54] PHOTOELECTRONIC DEVICE WITH AN ELECTROMAGNETIC SHIELDING MEMBER FOR ELECTROMAGNETICALLY ISOLATING A LIGHT EMITTING ELEMENT FROM A LIGHT RECEIVING ELEMENT

[75] Inventors: Yoshitoshi Matsumoto; Fuyuhiko Murofushi, both of Komoro, Japan

[73] Assignee: Hitachi, Ltd., Tokyo, Japan

[21] Appl. No.: 843,760

[22] Filed: Mar. 25, 1986

[30] Foreign Application Priority Data

Mar. 25, 1985 [JP] Japan .................. 60-58422

[51] Int. Cl.⁴ .............................. G02B 27/00
[52] U.S. Cl. ..................... 250/551; 455/602
[58] Field of Search .............. 250/227, 551; 307/311; 455/601, 602, 606, 607, 612

[56] References Cited

U.S. PATENT DOCUMENTS

| 3,418,480 | 12/1968 | Miller | 250/551 |
| 4,104,533 | 8/1978 | Iverson | 250/551 |
| 4,270,029 | 5/1981 | Sato et al. | 455/601 |
| 4,501,022 | 2/1985 | Oswald | 455/601 |
| 4,539,480 | 9/1985 | Artinano et al. | 250/551 |
| 4,570,079 | 2/1986 | Davis | 250/551 |

Primary Examiner—David C. Nelms
Assistant Examiner—Stephone B. Allen
Attorney, Agent, or Firm—Antonelli, Terry & Wands

[57] ABSTRACT

A photoelectronic device including an electromagnetic shield and an optical transmitter. The electromagnetic shield includes a shield member which is interposed between a light emitting element and a light receiving element or device for electromagnetically isolating a conductor for applying a signal to the light emitting element and a conductor for extracting an electric signal from the light receiving element. The optical transmitter includes a transparent member disposed in the shield member for guiding the light emitted from the light emitting element to the light receiving element.

19 Claims, 6 Drawing Figures

PHOTOELECTRONIC DEVICE WITH AN ELECTROMAGNETIC SHIELDING MEMBER FOR ELECTROMAGNETICALLY ISOLATING A LIGHT EMITTING ELEMENT FROM A LIGHT RECEIVING ELEMENT

BACKGROUND OF THE INVENTION

The present invention relates to a photoelectronic device for optical communications.

Optical communications are rapidly developing as a new communication system. Optical communications use light as an information transmitting medium and optical fibers are used as paths for transmitting the light. Optical communications are also called "optical fiber communications" and can effect communications with lower loss, wider band, longer distance and higher capacity than those of communications using coaxial cables of the prior art. A semiconductor laser element is generally used as a light source and is one of the light sources, which is not only small and light weight, but is also capable of performing direct, high-speed modulation and high-capacity communication with a low-voltage drive.

For realizing long-distance communications, an optical repeater is often required, which repeater serves to amplify d.c. power which attenuates in an optical fiber. The optical repeater is also required to have another function of monitoring whether or not the frequency of the light input from the optical fiber to the optical repeater is equal to that of the light output from the optical repeater to another optical fiber. For this function, a semiconductor laser device is required for optical communications, which is equipped with a light emitting element and a light receiving element in a common package.

As a semiconductor laser device, a laser module for communications has been proposed as described in "Hitachi Review", Vol. 33, No. 4, pp 193 to 198 (1984). This semiconductor laser device is assembled into a directly opposed package, in which the leading end of an optical fiber is opposed to face the end face of an oscillator of a semiconductor laser element. This package is provided as a box-shaped, flattened module. This semiconductor laser device has a recess at a central portion of the principal plane of a metallic stem of the module. The recessed portion is sealed with a cap which is made of a metal plate. The sealed module is provided with a semiconductor laser element (or a laser chip) and a light receiving element which is made operative to detect the power or frequency of a laser beam emitted from the end face of the oscillator of the laser element or chip. In the recess, there also exists a conductor for applying an a.c. signal to the semiconductor laser element and a conductor for extracting an electric signal from the light receiving element. The aforementioned laser module for optical communications exhibits a sufficient function as a semiconductor laser device for optical communications. Despite this fact, however, this laser module is required, like other devices, to have higher performance characteristics.

At the present stage of development of optical communications, the information transmission rate is about 140 to 200 Mbits/sec, but is expected to be 560 Mbits/sec or several Gbits/sec in the future, in accordance with the expected drastic increase in the amount of information to be transmitted.

SUMMARY OF THE INVENTION

It is an object of the present invention to provide a photoelectronic device which enables optical communication at a high information transmission rate.

It is another object of the present invention to provide photoelectronic device which includes means for preventing electromagnetic coupling between conductor for a light emitting element and a conductor for extracting an electric signal from a light receiving element while enabling optical transmission between the light emitting element and the light receiving element so as to enable precise and accurate monitoring of the frequency of the emitted light beam.

In accordance with the present invention, a photoelectronic device includes an electromagnetic shield member and an optical transmitter. The electromagnetic shield member serves for electromagnetically isolating a first conductor for applying an a.c. (e.g., RF) signal to a light emitting element and a second conductor for extracting an electric signal from a light receiving element. The optical transmitter includes a transparent member which is disposed through the electromagnetic shield member to guide the light from the light emitting element to the light receiving element. The electromagnetic shield member prevents the electromagnetic induction phenomena caused by an a.c. signal applied to the first conductor, from occurring in the second conductor. Moreover, the transparent member improves the optical coupling between the light emitting element and the light receiving element. As a result, a high accuracy monitor, which is required of the photoelectronic device, can be obtained to improve the information transmission rate.

According to features of the present invention, the shield member is made of conductive material and the shield member is made of the same material as that of a sealing member of the photoelectronic device so that the same thermal coefficient is provided. Additionally, the shield member is made of an iron alloy to improve the electromagnetically shield effect with the shield member being fixed on sealing member of a package forming the photoelectronic device by a conductive adhesive to facilitate assembly.

According to other features of the present invention, the transparent member is made of glass and is constructed as a lens to improve the efficiency of introducing the light into the light receiving element. Further, the transparent member, in accordance with a feature, is made as thick as the shield member but does not extend beyond the surface of the latter so as to prevent breakage or damage to the surface thereof during assembly. On the other hand, the transparent member, in accordance with another feature, is constructed so as to extend from the shield member and to have opposite end faces close to the light emitting element and the light receiving element so that the light may be efficiently extracted from the light emitting element to irradiate the light receiving element.

The photoelectronic device in accordance with the present invention is constructed as a package having an outer wall forming a part of the shield member, and the transparent member is attached to a portion of the shield member. Moreover, the light receiving member is built in that outer wall to provide the photoelectronic device in which the light emitting element and the light receiving element are integrally formed. Since the outer wall of the package can be used commonly as the shield member, according to this construction, the cost of the package can be reduced.

These and further objects, features and advantages of the present invention will become more obvious from the following description when taken in connection with the accompanying drawing wherein:

DESCRIPTION OF THE PREFERRED EMBODIMENTS

Figure 1:
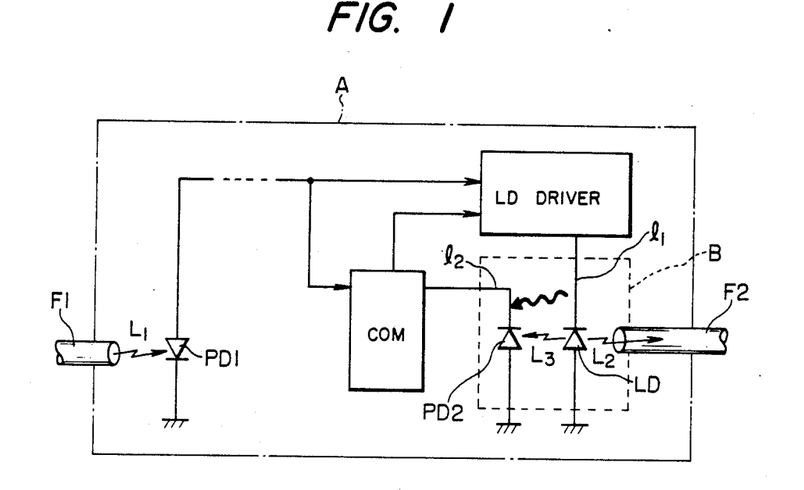
FIG. 1 is a schematic diagram for explaining the problems of a photoelectronic device in which a semiconductor laser element and a light receiving element are fixed in a common package.

FIG. 1 is a schematic illustration of an optical repeater A which converts a light $L_1$ coming from an optical fiber F1 into an electric signal by the action of a light receiving element PDI and drives a semiconductor element in a photoelectronic device B through a semiconductor laser element driver LD Driver on the basis of that electric signal so that a laser beam $L_2$ may be introduced as optical information into an optical fiber F2. The optical repeater is formed with a feedback loop so as to monitor the optical power of the laser beam $L_2$. This feedback loop is provided for the d.c. component and frequency component of the laser beam $L_2$ and includes, as shown, a light receiving element PD2 for converting a laser beam $L_3$ corresponding to the laser beam $L_2$ and emitted by the semiconductor laser element LD in the photoelectronic device B, into an electric signal, and a comparator COM.

For a higher information transmission rate, the frequency of the drive signal from the LD driver for the semiconductor laser element LD is higher and this RF drive signal is applied to a line $l_1$ connected with the semiconductor laser element LD. In the photoelectronic device B, there is provided a line $l_2$ for transmitting the electric signal from the light receiving element PD2 to the comparator COM. The comparator COM is also supplied with the electric signal from the light receiving element PD1 and compares the frequencies of the two electric signals input thereto to thereby provide as an output thereof the compared result as a signal to the semiconductor laser driver LD Driver. The semiconductor laser driver LD Driver drives the semiconductor laser at the desired frequency in response to the signal from the comparator COM. The lines $l_1$ and $l_2$ are not electromagnetically isolated in the photoelectronic device B. If the RF signal is applied to the line $l_1$, it exerts an influence upon the line $l_2$ by the electromagnetic induction phenomena. More specifically, the lines $l_1$ and $l_2$ are electromagnetically coupled so that the two kinds of signals, i.e., an electrical signal caused by the emitted laser beam $L_3$ and an electrical signal caused by the electromagnetic coupling phenomena are applied to the line $l_2$. Thus, it is not possible to accurately monitor the frequency of the laser beam $L_2$ emitted from the semiconductor laser element LD. The electromagnetic coupling phenomena occurs at an information transmission rate about 140 MHz.

EMBODIMENT 1

Figure 2:
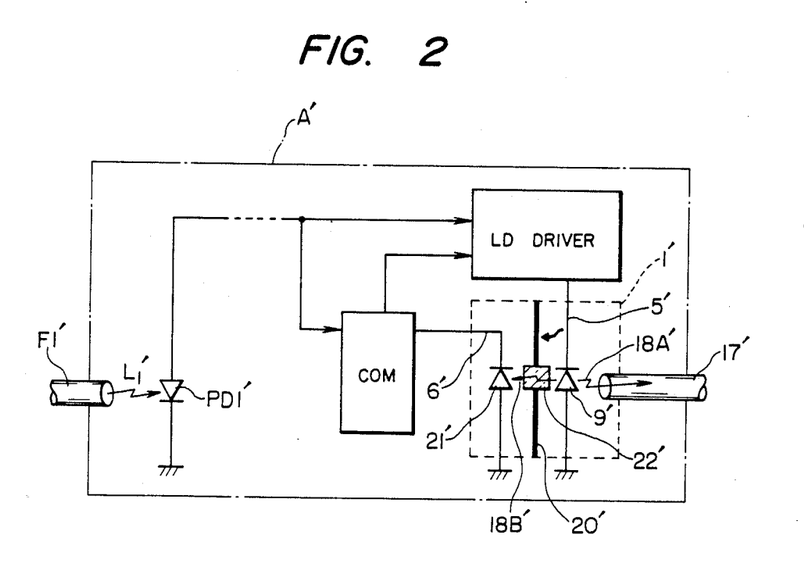
FIG. 2 is a schematic diagram showing a photoelectronic device which is equipped with an electromagnetic shield and an optical transmitter in accordance with the present invention.

FIG. 2 is a schematic illustration of an optical repeater utilizing a photoelectronic device 1 according to the present invention. As shown, the photoelectronic device 1 is equipped, between a line 5 to be fed with an RF signal from the LD Driver for driving a semiconductor laser element 9 and a line 6 for extracting an electric signal from a light receiving element 21, with a shield member 20 which acts as an electromagnetic shield for preventing electromagnetic coupling between the two lines 5 and 6, thereby preventing the occurrence of the electromagnetic phenomena between the two lines 5 and 6.

Between the light receiving element 21 and the semiconductor laser element 9, there is also interposed a transparent member 22 which acts a an optical transmitter for improving the optical coupling between the two elements 9 and 21. A monitor light beam 18B emitted from the semiconductor laser element 9 and corresponding to the laser beam 18A is always introduced into the light receiving element 21.

This arrangement provides a state in which only the electric signal generated from the monitor beam 18B by the light receiving element 21 is present in the line 6 so that the frequency of a corresponding laser beam 18A emitted by the semiconductor laser element 9 for introduction into an optical fiber 17 can be monitored highly accurately via the comparator COM and the LD Driver. As a result, a light $L_1$ input from an optical fiber F1 to the optical repeater A has the same frequency as that of the laser beam 18A introduced from the semiconductor laser 9 into the optical fiber 17. This is because the frequency of the laser beam 18A is controlled by the feedback loop on the basis of the electric signal on the line 6 which is immune to electromagnetic influence. As in the FIG. 1 illustration, reference character PD1 indicates a light receiving element for converting the light $L_1$ from the optical fiber F1 into an electric signal.

Figure 3:
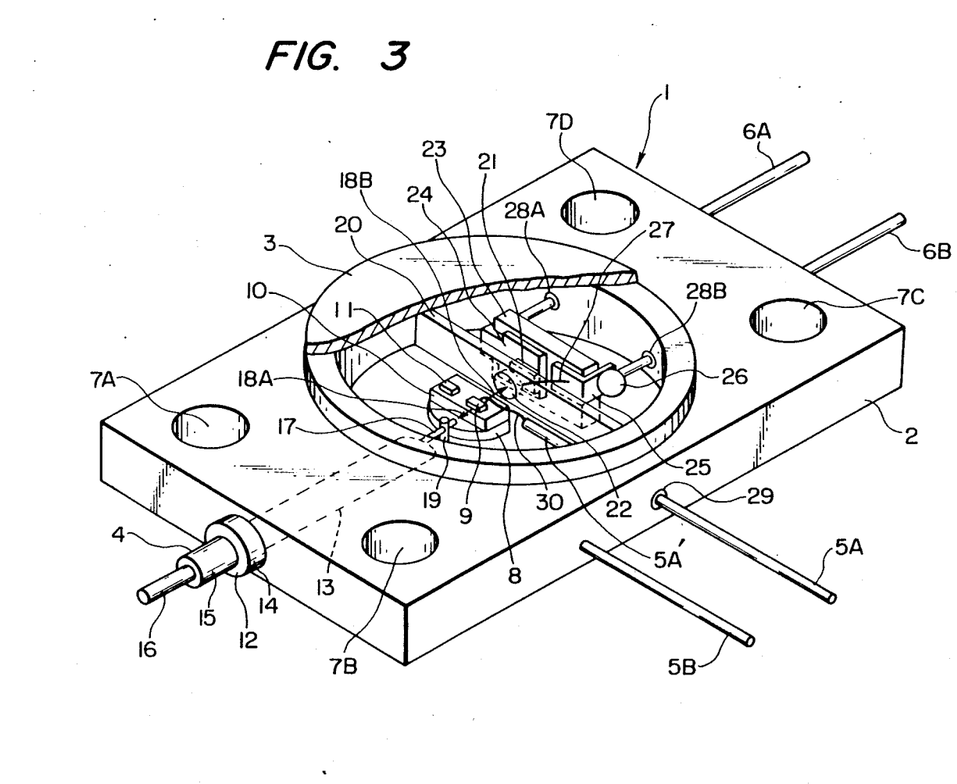
FIG. 3 is a partially cut-away perspective view showing a main portion of a photoelectronic device which embodies the present invention.
Figure 4:
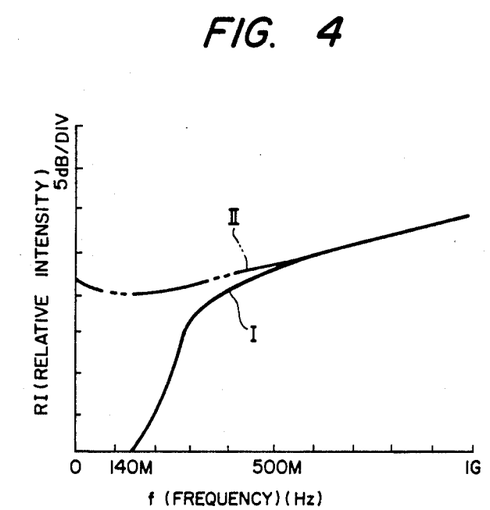
FIG. 4 is a graph plotting the frequency of an output light against a relative intensity for explaining an effect of the present invention.

FIG. 3 is a partially cut-away perspective view showing an essential portion of the photoelectronic device 1 according to one embodiment of the present invention, and FIG. 4 is a graph for explaining the effects of the photoelectronic device of the present invention. The photoelectronic device 1 (or the semiconductor laser device) according to this embodiment is formed as a flattened module package, as shown in FIG. 3. The package which is a sealed package is constructed of a box-shaped metallic stem 2 having its principal surface formed with a recess in which individual parts are assembled and a metallic cap 3 hermetically closes and seals the recess of the stem 2. This stem 2 is made of KOIVAR whereas the cap 3 is made of KOVAR or stainless steel. From the package thus constructed, there protrudes one optical fiber 4 and two pairs of leads 5A and 5B, and 6A and 6B. The stem 2, as shown, is provided with mounting holes 7A, 7B, 7C and 7D at the four corners thereof.

A laser chip 9 is fixed on a mount 8 which is placed at the center of the recess of the stem 2. The laser chip 9 is fixed on the mount 8 through a small support member or submount 10 which is made of a conductive material such as silicon. In addition to the laser chip 9, a pedestal 11 is fixed on small support member 10. That pedestal 11 is a small member which is constructed so as to enable characteristic test preceding the attachment of the laser chip 9 to the mount 8 and which is formed as an insulating member having a conductive surface. As a result, the small support member 10 can be removed at the stage when it is fixed on the mount 8.

A cylindrical fiber guide 12 is fitted and hermetically fixed on the circumferential wall of the stem 2 by means of solder. The fiber guide 12 is constructed of a long sleeve 13 inserted into the stem 2, a radially enlarged stopper 14 abutting against the side face of the stem 2, and a caulked portion 15 thinner than the stopper 14. The sleeve 13 is made to have an external diameter of 0.4 mm and internal diameter of 0.2 mm, for example. Moreover, a portion of the optical fiber 4 is inserted into the fiber guide 12 and the inserted portion includes a jacket 16, and a cable 17 in which the jacket 16 at the leading end, within the recess, is peeled away to expose the core and cladding. The cable 17 has its leading end formed into a conical shape to make the leading end core face the end (or light emitting) face of one resonator of the laser chip 9 so that the laser beam 18A emitted from the laser chip 9 is efficiently introduced into the core. For optical alignment, the leading end portion of the cable 17 is inserted into an opening formed in a stationary post 19 fixed on the stem 2 and the leading end portion is fixed therein by a fixing agent. As a result, the leading end of the cable 17 is immovable with respect to the light emitting portion of the laser chip 9 so that it is always held in an excellently aligned state.

At a position opposed to the fiber guide 12, there is arranged an electromagnetic shield member 20 which acts as the electromagnetic shield. The shield member 20 is disposed for preventing electromagnetic coupling between the lead 5a and a wire 30 for applying an RF signal to the laser chip 9 provided on one side of the shield and conductors 24, 25 and a wire 27 for extracting an electric signal from a light receiving element 21 provided on the other side of the shield. The shield member 20 is made of the same material such as a ferromagnetic iron alloy or KOVAR as that of the package 1. Additionally, the shield member 20 is electrically connected to the package 1 so that the light receiving element 21 is electromagnetically shielded during operation of the laser chip 9.

The shield member 20 and the package 1 are made of identical material in the above construction so as to have equal coefficients of thermal expansion. In this manner, the position of a glass member 22, attached to the shield member 20, is prevented from fluctuating from the optical axis of the laser chip 9 and the light receiving element 21 during the operation of the laser chip 9. This ensures that the light emanating from the laser chip 9 always reaches the light receiving element 21.

The shield member 20 may be formed integrally with the package 1. Considering the ease of assembly, however, it is preferred that the package 1 and the shield member 20 be prepared separately and assembled in the package 1 by means of a conductive adhesive such as a silver solder. Th shield member 20 is also electrically connected with the cap 3 and is separated spatially and electromagnetically from the light receiving element 21 and the laser chip 9. The shield member 20 and the cap 3 may be electrically connected by means of an adhesive. More preferably, the shield member 20 may have a construction in which it is held in uniform contact with the cap 3 and this arrangement is preferred since it does not require an additional production step.

Within the electromagnetic shield member 20, the glass member 22 is fixed and is made of a transparent material so as to act as an optical transmitter for guiding a laser beam 18B emitted from the laser chip 9 into the light receiving element 21. The glass member 22 should be as thick as the shielding member 22 such that it does not extend beyond the surface of the shield member 20. This thickness facilitates the assembly of the shield member 20 with the glass member 22 in the limited recess of the package 1 and prevents the glass member 22 from being folded and having its exposed surface damaged during the assembly.

The shield member 20 with the glass member 22 is preferably fixed in the package 1 before the laser chip 9 and the light receiving element 21 are assembled in the package 1. This assembly prevents the heat treatment involved in the assembly of the shield member 20 from being influenced by the characteristic fluctuations of the laser chip 9 and the light receiving element 21.

If the glass member 22 is constructed as a lens, moreover, the optical power capable of reaching the light receiving element is increased to make the monitoring operation more reliable and accurate.

A block 23 of insulating material is attached to the inner ends of the two leads 6A and 6B opposed to the fiber guide 12. The leads 6A and 6B are connected by means of solder 26 to portions of conductors 24 and 25 which extend from the principal surface to the sides of the block 23. The light receiving element 21 is fixed to one conductor 24, and a wire 27 which has one end connected to the electrode of the light receiving element 21 and has the other end connected to the other conductor 25. The leads 6A and 6B, the conductors 24 and 25 and the wire 27 form together a second conductor. As a result, the paired leads 6A and 6B provide the output terminals of the light receiving element 21, from which the electric signal is extracted. The paired leads 6A and 6B are fixed to the stem 2 through insulators 28A and 28B, respectively.

Like the leads 6A and 6B, one lead 5A for the laser chip 9 is fixed in the stem 2 through an insulator 29 and connected to the surface electrode of the laser chip 9 through the wire 30. The lead 5A and the wire 30 form together a first conductor. The other lead 5B for the laser chip 9 provides a third conductor and is fixed directly to the stem 2. This lead 5B is electrically connected with the lower electrode of the laser chip 9 through the stem 2 and the small support member 10. As a result, when a predetermined voltage is applied between the paired leads 5A and 5B, the laser beams 18A and 18B are emitted from the light emitting surface of the laser chip 9.

In the photoelectronic device (or the semiconductor laser device) thus constructed with the optical fiber the laser beams 18A and 18B are emitted from the end faces of the resonator of the laser chip 9 when a predetermined voltage is applied between the paired leads 5A and 5B. The optical information carried by the laser beam 18A is transmitted to desired place through the optical fiber 4 acting as the transmitting medium. On the other hand, the optical power and frequency of the laser beam 18B are monitored at all times by the light receiving element 21 so that they may be maintained constant.

In this photoelectronic device, the wire 30 for feeding the RF signal to the laser chip 9, the lead 5A' extending in the package 1 to that wire 30, the wire 27 extending in the package 1 for extracting the electric signal from the light emitting element 21, and the conductors 23 and 24 are isolated by the electromagnetic shield member 20. As a result, no electromagnetic coupling occurs even for an information transmission rate of 560 Mbits/sec so that the frequency of the laser beam 18B can be monitored accurately and highly precisely by the light receiving element 21.

The relative intensity RI (in dB) of the monitor signal is plotted for examination against the frequency f (in Hz) of the laser beam 18B, as shown in the graph of FIG. 4. The relative intensity RI is indicated by a solid curve I in the case of electromagnetic coupling and by a double-dotted curve II in the case of the optical and electromagnetic coupling. As a result, any frequency over 600 MHz will make it absolutely impossible to detect the variation in the frequency of the optical power due to the effect of electromagnetic coupling. The ordinate is scaled at a rate of 5dB/div. More specifically, the difference of the curve II from the curve I implies the intensity exclusively of the optical coupling, and the frequency of the laser beam 18B can be monitored by the light receiving element so long as the difference becomes zero. The optical d.c. power of the laser beam 18A can be accurately monitored even if electromagnetic coupling occurs. This is because electromagnetic coupling is a phenomenon peculiar to alternating current.

In the case of the photoelectronic device according to this embodiment, the electromagnetic shield member 20 is interposed between the wire 30 and the lead 5A', and the wire 27 and the conductors 24 and 25 so that consideration is taken to prevent electromagnetic coupling. The laser beam 18B reaches the light receiving element 21 through the glass member 22 arranged in and through the shield member 20 so that its frequency can be detected accurately and reliably. Since the photoelectronic device of the embodiment is constructed to be free of the electromagnetic coupling, the signal oscillated from the laser chip 9 can be monitored so long as its frequency is within the range of the shielding frequency of about 1 GHz of the light receiving element 21 or within the modulatable range of the frequency (e.g., 1 to several GHz) to 600 MHz of the semiconductor laser.

EMBODIMENT 2

Figure 5:
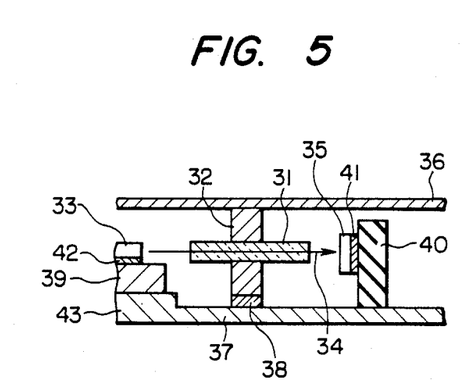
FIG. 5 is a sectional view showing an electromagnetic shield according to another embodiment of the present invention and depicts the state in which a transparent member extends from the electromagnetic shield.

FIG. 5 is an enlarged view showing an essential portion of the photoelectronic device according to another embodiment of the present invention. In this embodiment, the transparent member has a shape different from that of Embodiment 1. A glass member 31 acting as the transparent member is constructed as an elongated glass rod (e.g., a SELFOC lens). The glass member 31 is fixed within an electromagnetic shield member 32 made of a conducting material (e.g., KOVAR) to guide a beam 34 emitted from a laser chip 33 acting as a light emitting element to a light receiving element 35. The electromagnetic shield member 32 is held in electrical contact with a cap 36 and is fixed to a stem 37 by means of a conductive adhesive 38 such as silver solder. The shielding member 32 thus constructed provides effects similar to those of the Embodiment 1 by isolating the laser chip 33 and the light receiving element 35 electromagnetically and spatially from each other. Since the transparent member 31 of the elongated glass rod has its two opposite ends close to the laser chip 33 and the light receiving element 35, it can efficiently receive the beam 34 emitted from the laser chip 33 and irradiate the light receiving element 35 with the beam 34.

The laser chip 33 is fixed on a submount 39 made of silicon by means of solder 42, and the submount 39 is in turn fixed on a mount 43 placed on the stem 37. The light receiving element 35 is fixed on a conductor 41 which is attached to an insulating block 40. That stem 37 is fixed at the ground potential providing a first operation potential of the laser chip 33 to electromagnetically shield the laser chip 33 and the light receiving element 35.

EMBODIMENT 3

Figure 6:
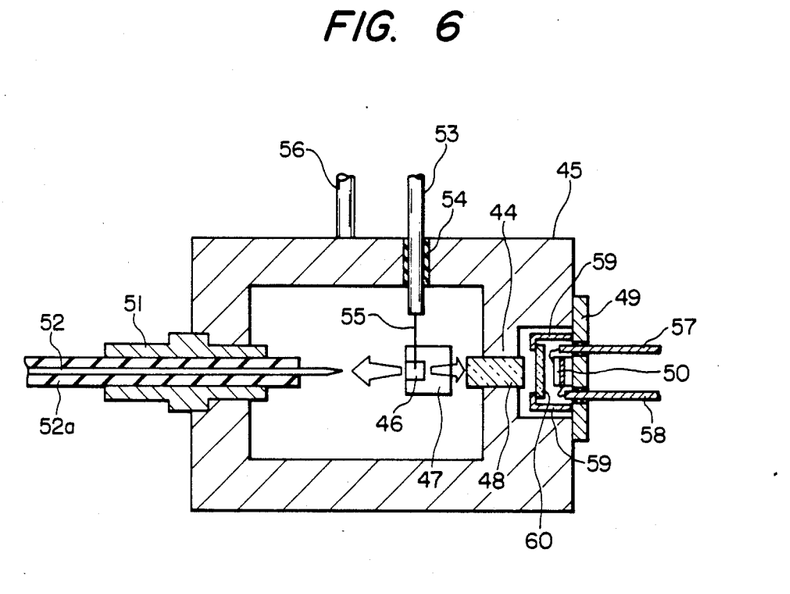
FIG. 6 is sectional view showing a photoelectronic device according to another embodiment of the present invention and depicts the state in which the outer wall of the package forms part of the electromagnetic shield.

FIG. 6 is a sectional view showing still another embodiment of the present invention wherein a shield member 44 acting as the electromagnetic shield is formed as part of the outer wall of a sealing package 45 and a light receiving device is built in the outer wall.

Within the package 45, there is fixed through a submount 47 a laser chip 46 which acts as a light emitting element so that one of emanating beams is guided through a transparent member 48 disposed in the shield member 44 so as to optically transmit the beam to a light receiving element 50 disposed in a light receiving device 49 attached to the package 45 and acting as a light receiver. The other beam emitted from the laser chip 46 is introduced into an optical fiber 52 which extends through a fiber guide 51 disposed in the package 45. The optical fiber 52 is protected by a plastic jacket 52a.

In the package 45, there is fixed a lead 53 which is provided for applying a signal to the laser chip 46 and which has its leading end portion connected with the electrode of the laser chip 46 through a wire 55. Moreover, a lead 56 for applying a potential to the package 45 is connected with the package 45 so that the laser chip 46 may emit the beam by applying a predetermined potential between the leads 53 and 56. The light receiving device fixed in the outer wall of the package 45 is equipped with the leads 57 and 58 for extracting an electric signal from the light receiving element 50, which includes a cap 59 and a glass member 60 attached to the cap 59.

In the photoelectronic device of the present embodiment, like the foregoing Embodiments 1 and 2, the laser chip 46 and the light receiving element 50 are electromagnetically isolated due to the presence of the electromagnetic shield member 44 so that electromagnetic coupling therebetween is prevented. Moreover, due to the presence of the transparent member 48, the optical coupling between the laser chip and the light receiving device can be improved so that highly accurate monitoring of the frequency of the beams emitted from the laser chip 46 can be achieved even for an information transmission rate of 560 Mbits/sec.

As illustrated, the photoelectronic device of the present embodiment has a construction in which the light receiving device 49 is attached to the outer wall of the package 45. This makes it simple to replace the light receiving device 49 so that a light receiving element for matching the information transmission rate can be easily selected and mounted, thereby reducing production cost. Moreover, since the outer wall of the package 45 is used to form a part of the electromagnetic shield member 44, the necessity for forming the electromagnetic shield member separately and attaching it to the package 45 can be eliminated to further reduce the production cost.

The following effects can be attained from the afore-described embodiments:

(1) Since the line for driving the light emitting element and the line for extracting the signal are isolated by the electromagnetic shielded member, the photoelectronic device of the present invention is free from electromagnetic coupling between the two lines even for an information transmission rate of 560 Mbits/sec. This construction provides an effect that the frequency of the laser beam can be monitored by the light receiving element accurately and highly precisely.

(2) Since the photoelectronic device of the present invention is constructed to establish no electromagnetic coupling, according to the above effect (1), the frequency monitoring can be conducted within either the shielding frequency range of the light receiving element or the modulatable range of the semiconductor laser to provide an effect that the photoelectronic device can be used for remarkably rapid optical communications having an information transmission rate as high as 600 Mbits/sec to provide high capacity communications.

(3) Since the laser chip and the light receiving element are attached to a single stem and are hermetically sealed by means of the cap, according to the above effect (2), the photoelectronic device of the present invention can enjoy an effect that it is highly resistant to humidity so as to have a high reliability.

(4) Due to the above effects (1) to (3), according to the present invention, there can be attained a combination of effects which make it possible to provide a photoelectronic device which has high information transmission capacity and reliability.

While we have shown and described several embodiments in accordance with the present invention, it is understood that the same is not limited thereto but is capable of numerous changes and modifications as known to those skilled in the art and we therefore do not wish to be limited to the details shown and described herein but intend to cover all such changes and modification as are encompassed by the scope of the appended claims.

What is claimed is:

1. A photoelectronic device comprising:
    light emitting means;
    light receiving means for receiving light emitted from said light emitting means and providing an output signal indicative thereof;
    first conductor means for applying a signal to said light emitting means, said light emitting means being responsive to said signal for emitting light in accordance therewith;
    second conductor means coupled to said light receiving means for extracting said output signal from said light receiving means;
    electromagnetic shielding means including an electromagnetic shield member for electromagnetically isolating said light emitting means and said first conductor means from said light receiving means and said second conductor means;
    optical transmitting means including a transparent member disposed in said electromagnetic shield member between said light emitting means and said light receiving means for guiding light emitted from said light emitting means to said light receiving means;
    sealing means delimiting a chamber for receiving said light emitting means and said light receiving means therein, said shielding member being disposed in said chamber for separating said chamber into one compartment in which said light emitting means is disposed and another compartment into which said light receiving means is disposed; and
    an optical fiber provided within said sealing means for extracting light emitted by said light emitting means and for guiding the extracted light exteriorly of said sealing means.

2. A photoelectronic device according to claim 1, wherein said electromagnetic shield member is a conductive member.

3. A photoelectronic device according to claim 1, wherein said transparent member is a glass member.

4. A photoelectronic device according to claim 1, wherein said transparent member is a lens.

5. A photoelectronic device according to claim 1, wherein said light emitting means is a semiconductor laser element.

6. A photoelectronic device according to claim 1, wherein said sealing means and said electromagnetic shield member are formed of the same material.

7. A photoelectronic device according to claim 6, wherein said sealing means and said electromagnetic shield member are conductive.

8. A photoelectronic device according to claim 7, wherein said electromagnetic shield member is formed of an iron alloy.

9. A photoelectronic device according to claim 1, further comprising an adhesive for fixing said electromagnetic shield member to said sealing means.

10. A photoelectronic device according to claim 1, wherein said electromagnetic shield member has a predetermined thickness, and said transparent member has a thickness of said predetermined thickness so that said transparent member does not extend beyond the surface of said electromagnetic shield member.

11. A photoelectronic device according to claim 1, wherein said transparent member extends beyond the surface of said electromagnetic shield member.

12. A photoelectronic device according to claim 1, wherein said light emitting means is operated at a first operation potential, and said sealing means is maintained at the same potential as said first operation potential of said light emitting means.

13. A photoelectronic device according to claim 1, further comprising means coupled to said first and second conductor means for enabling monitoring of the light emitted by said light emitting means and for controlling the signal applied to said light emitting means through said first conductor means thereby to maintain a predetermined frequency of the output of said light emitting means.

14. A photoelectronic device comprising:
    a conductive sealing means delimiting a chamber therein for receiving a light emitting means therein;
    a light emitting means disposed in the chamber;
    electromagnetic shielding means including an electromagnetic shield member formed as an outer wall of the chamber of said sealing means, said electromagnetic shielding means forming a compartment outside of said chamber;

optical transmitting means including a transparent member disposed in a portion of said electromagnetic shield member for guiding light emitted from said light emitting means in the chamber of said sealing means through said electromagnetic shield member;

a light receiving device including light receiving means disposed within said compartment, proximate to said transparent member in said sealing means for receiving the light guided by said transparent member; and an optical fiber for guiding light emitted from said light emitting means within said chamber of said sealing means to the exterior thereof.

15. A photoelectronic device according to claim 14, wherein said transparent member is glass.

16. A photoelectronic device according to claim 14, wherein said transparent member is a lens.

17. A photoelectronic device according to claim 14, further comprising means coupled to said light emitting means and said light receiving means for monitoring of the light emitted by said light emitting means and controlling a signal applied to said light emitting means for maintaining the output of said light emitting means at a predetermined frequency.

18. A photoelectronic device comprising:
a package having a chamber;
a laser diode disposed in said chamber, said laser diode having two end faces for emitting laser beams;
a photodiode disposed in said chamber for receiving one of said laser beams emitted from one of said two end faces, and providing an output signal indicative thereof;
a first conductor for applying a signal to said laser diode, said laser diode being responsive to said signal for emitting said laser beams from said two end faces in accordance therewith;
a second conductor coupled to said photodiode for extracting said output signal from said photodiode;
electromagnetic shielding member for electromagnetically isolating said laser diode and said first conductor from said photodiode and said second conductor, said electromagnetic shielding member being disposed in said chamber for separating said chamber into one compartment in which said laser diode is disposed and another compartment in which said photodiode is disposed;
optical transmitting means including a transparent member disposed in said electromagnetic shielding member between said laser diode and said photodiode for guiding said one of said laser beams emitted from said one of said two end faces to said photodiode; and
an optical fiber provided with said package for extracting the other of said laser beams emitted from the other of said two end faces and for guiding the extracted laser beams exteriorly of said package.

19. A photoelectronic device comprising:
light emitting means;
light receiving means for receiving light emitted from said light emitting means and providing an output signal indicative thereof;
first conductor means for applying a signal to said light emitting means, said light emitting means being responsive to said signal for emitting light in accordance therewith;
second conductor means coupled to said light receiving means for extracting said output signal from said light receiving means;
electromagnetic shielding means including an electromagnetic shield member for electromagnetically isolating said light emitting means and said first conductor means from said light receiving means and said second conductor means; and
optical transmitting means including a transparent member disposed in said electromagnetic shield member between said light emitting means and said light receiving means for guiding light emitted from said light emitting means to said light receiving means.

* * * * *